United States Patent
Hayashi

(10) Patent No.: US 11,824,554 B2
(45) Date of Patent: Nov. 21, 2023

(54) ANALOG-TO-DIGITAL CONVERTER

(71) Applicant: SANKEN ELECTRIC CO., LTD., Niiza (JP)

(72) Inventor: Hideki Hayashi, Niiza (JP)

(73) Assignee: SANKEN ELECTRIC CO., LTD., Niiza (JP)

( * ) Notice: Subject to any disclaimer, the term of this patent is extended or adjusted under 35 U.S.C. 154(b) by 0 days.

(21) Appl. No.: 17/560,329

(22) Filed: Dec. 23, 2021

(65) Prior Publication Data

US 2023/0132135 A1    Apr. 27, 2023

(30) Foreign Application Priority Data

Oct. 21, 2021    (JP) .................... 2021-172450

(51) Int. Cl.
    *H03M 1/34*    (2006.01)
(52) U.S. Cl.
    CPC .................... *H03M 1/34* (2013.01)
(58) Field of Classification Search
    None
    See application file for complete search history.

(56) References Cited

U.S. PATENT DOCUMENTS

| 2002/0190887 | A1  | 12/2002 | Takata et al. | |
| 2016/0126970 | A1* | 5/2016  | Xu ............. | H03M 1/1245 341/120 |
| 2019/0013820 | A1* | 1/2019  | Ohhata ......... | H03M 1/1245 |
| 2023/0163777 | A1* | 5/2023  | Yagishita ...... | H03K 5/08 341/126 |

FOREIGN PATENT DOCUMENTS

| JP | S62-109434 A | 5/1987 |
| JP | H01-103320 A | 4/1989 |
| JP | 2002-374169 A | 12/2002 |

* cited by examiner

*Primary Examiner* — Patrick C Chen
(74) *Attorney, Agent, or Firm* — METROLEX IP LAW GROUP, PLLC

(57) ABSTRACT

An analog-to-digital converter is disclosed that converts an input analog potential to a digital conversion value. An analog-to-digital converter according to one or more embodiments may include a comparator that compares the input analog potential with a reference potential; and a conversion circuit that measures comparison operation time from a start to an end of a comparison operation by the comparator and outputs the digital conversion value according to the measured comparison operation time and a comparison result by the comparator.

6 Claims, 12 Drawing Sheets

【FIG. 1】
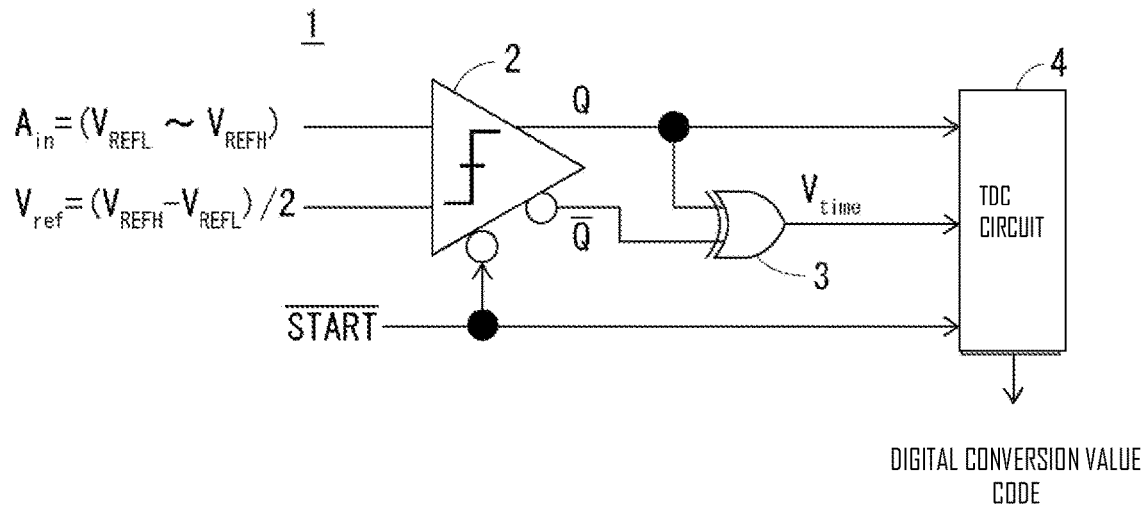
【FIG. 2】
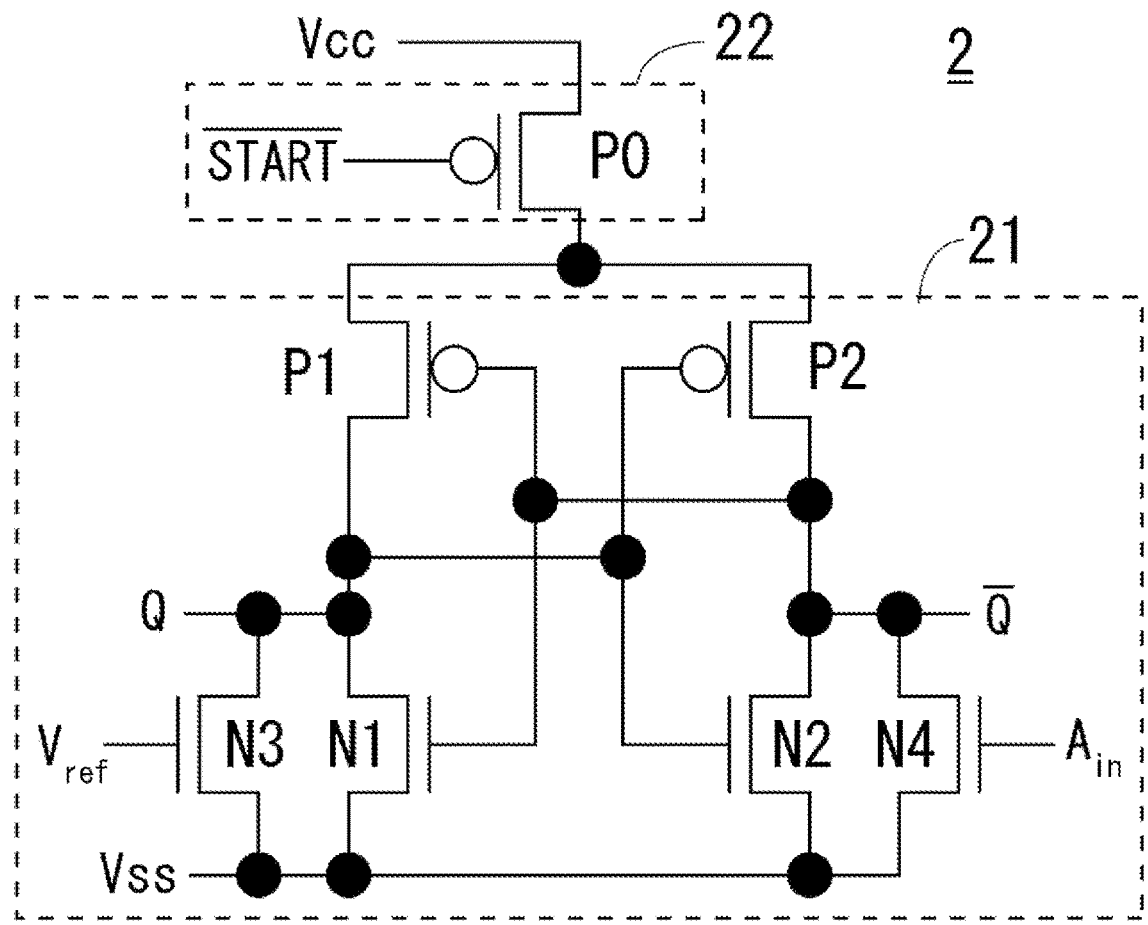

[FIG. 3A]
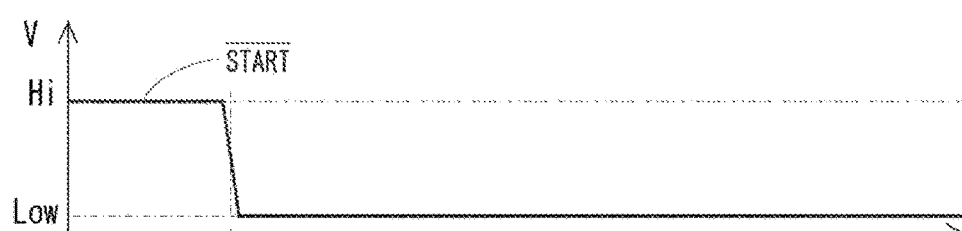
[FIG. 3B]
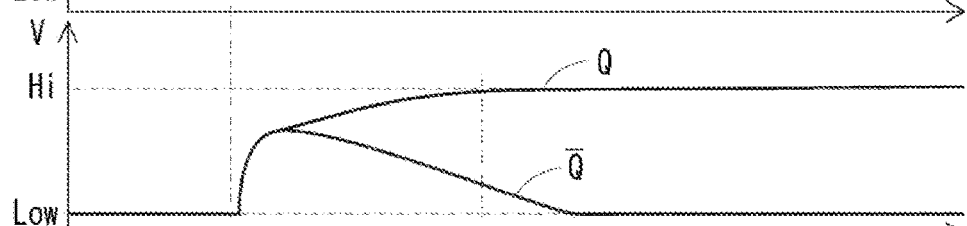
[FIG. 3C]
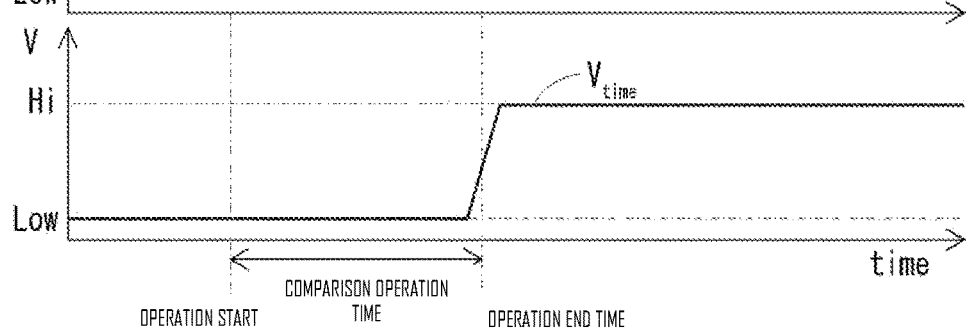
[FIG. 4]
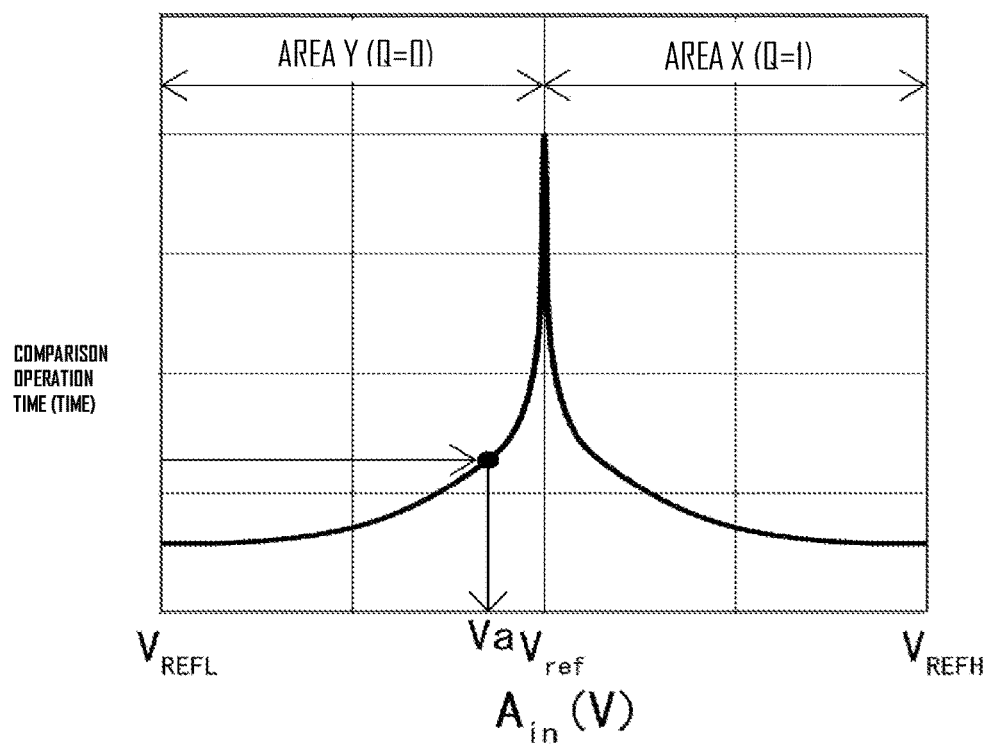

[FIG. 5A]
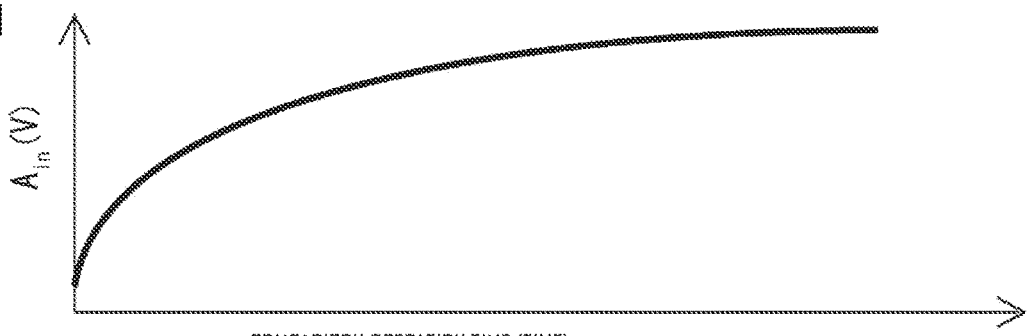
[FIG. 5B]
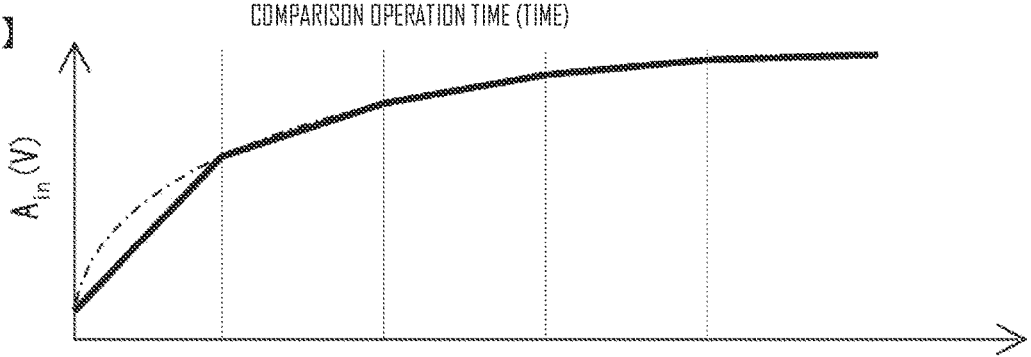
[FIG. 5C]
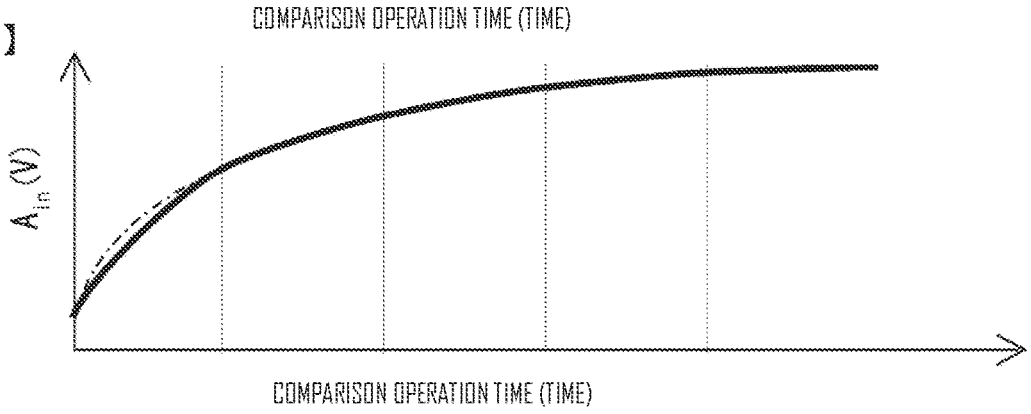

[FIG. 6]
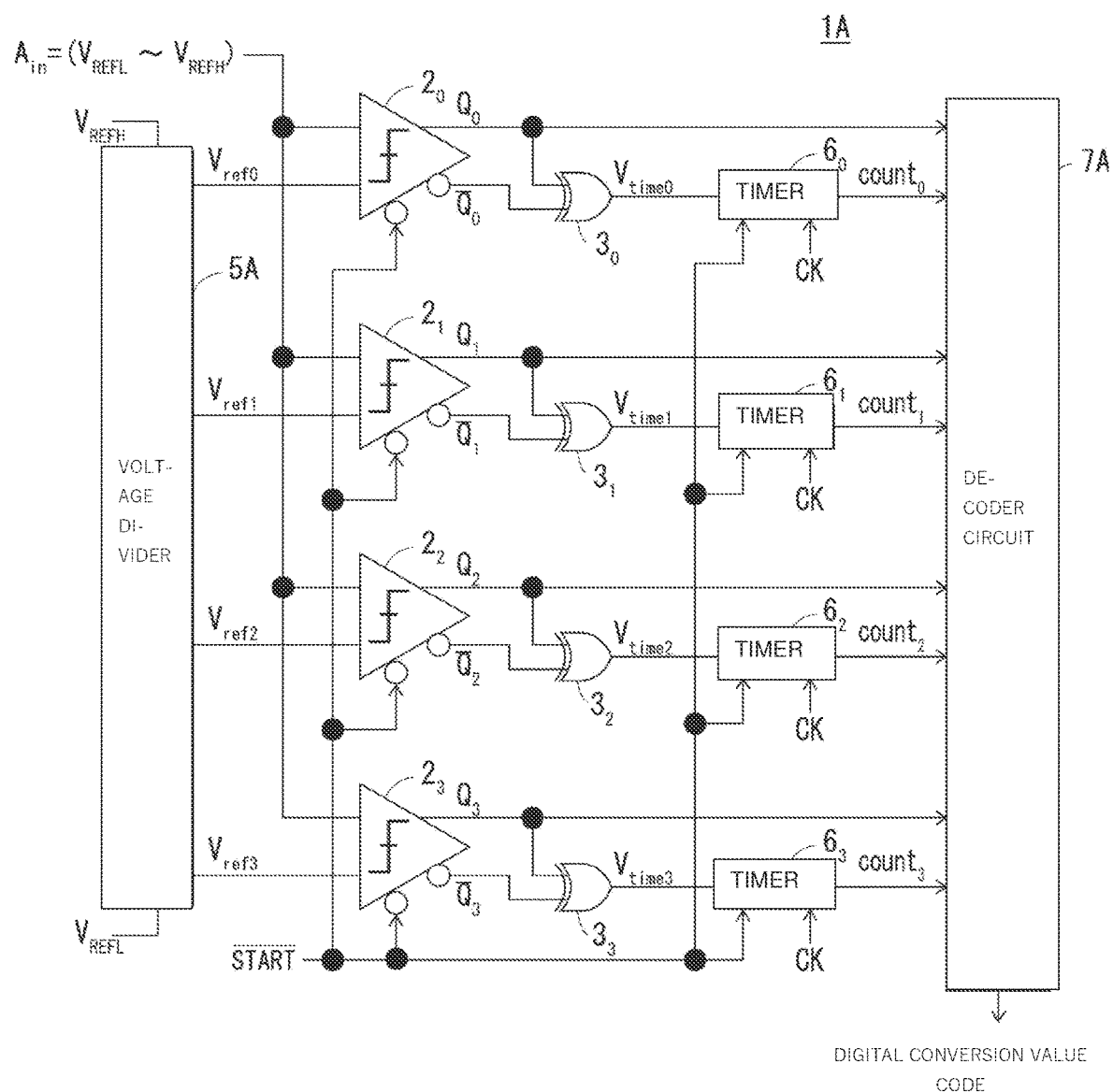

【FIG. 7】
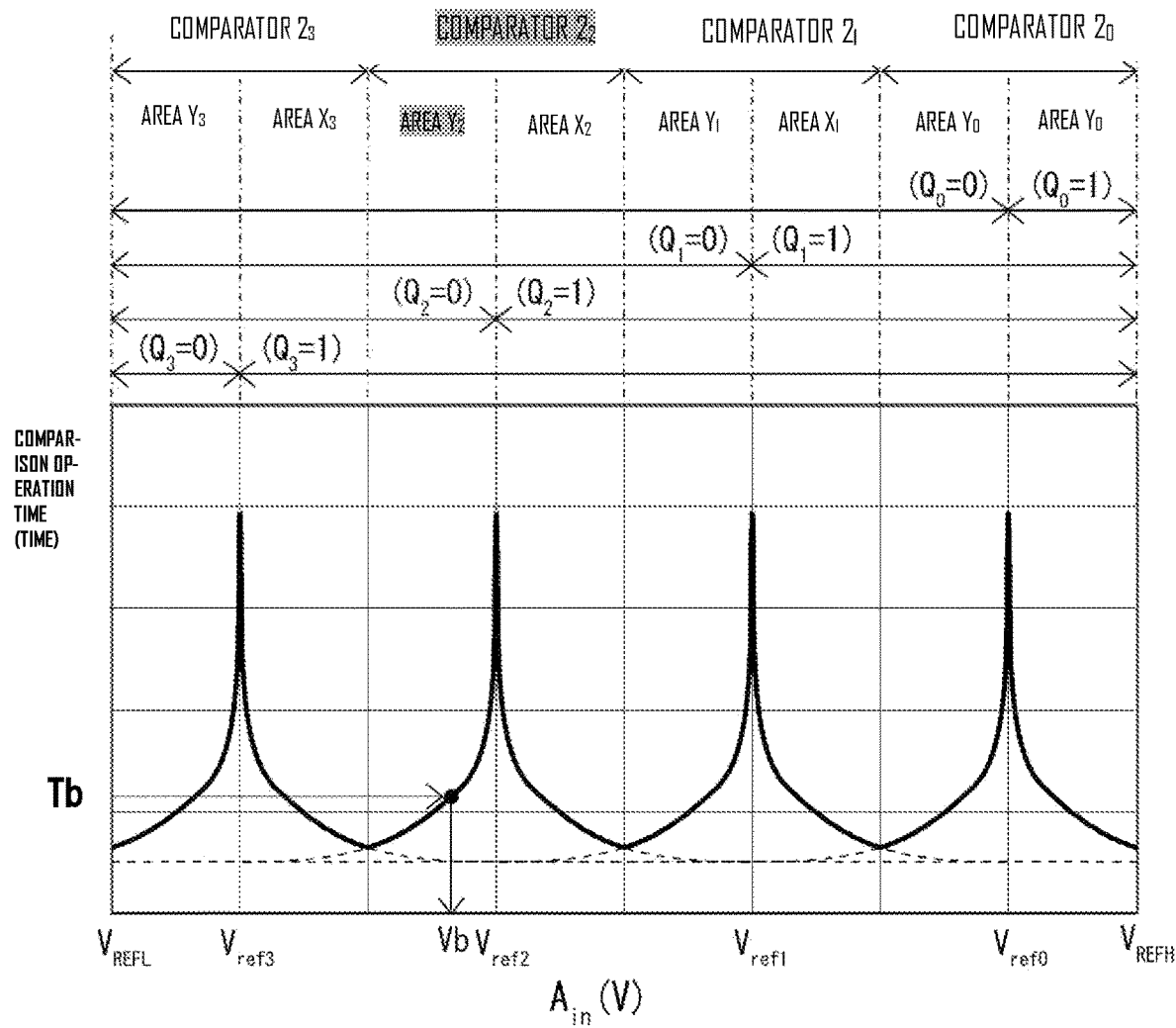

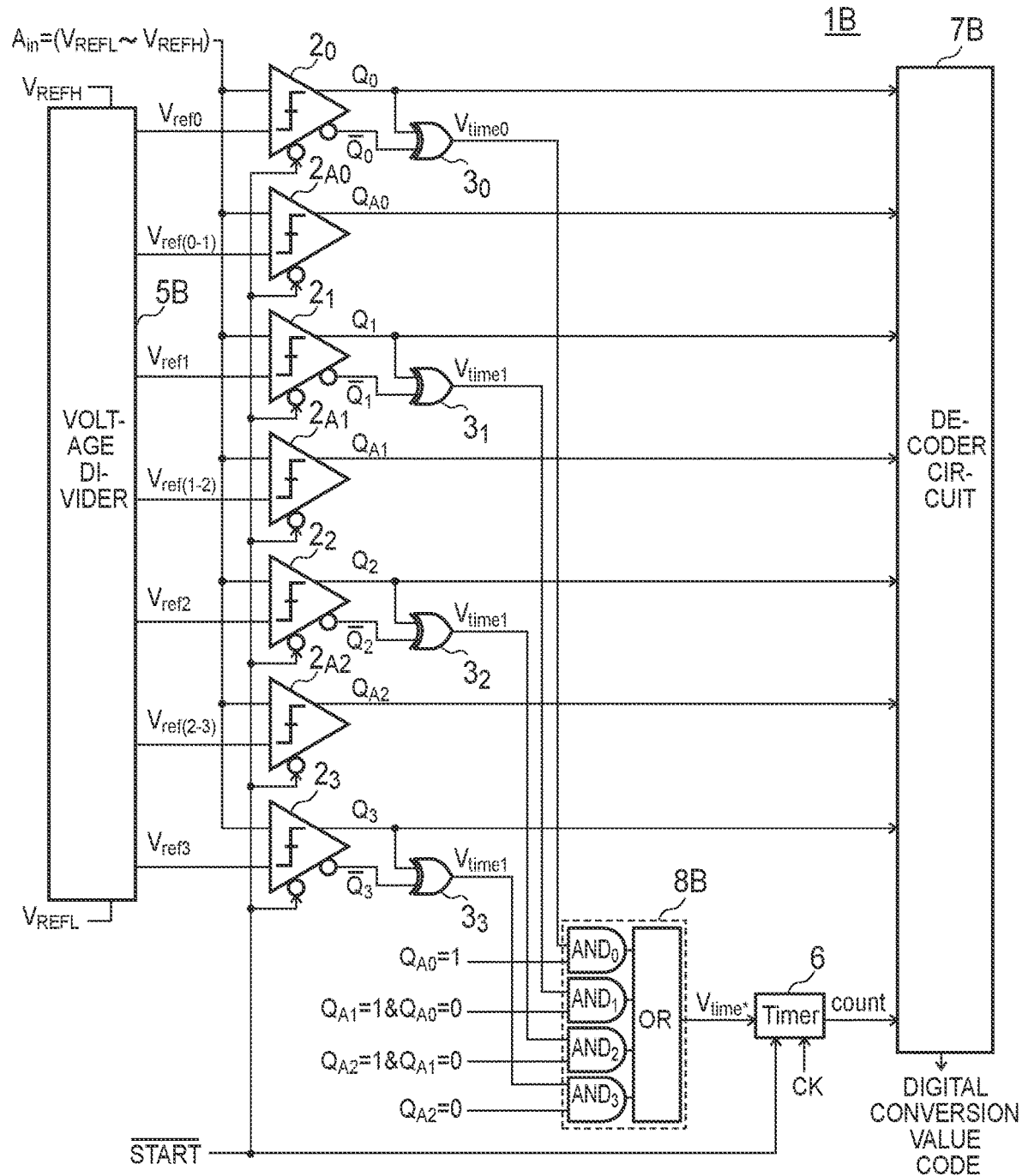
[FIG. 8]

【FIG. 9】
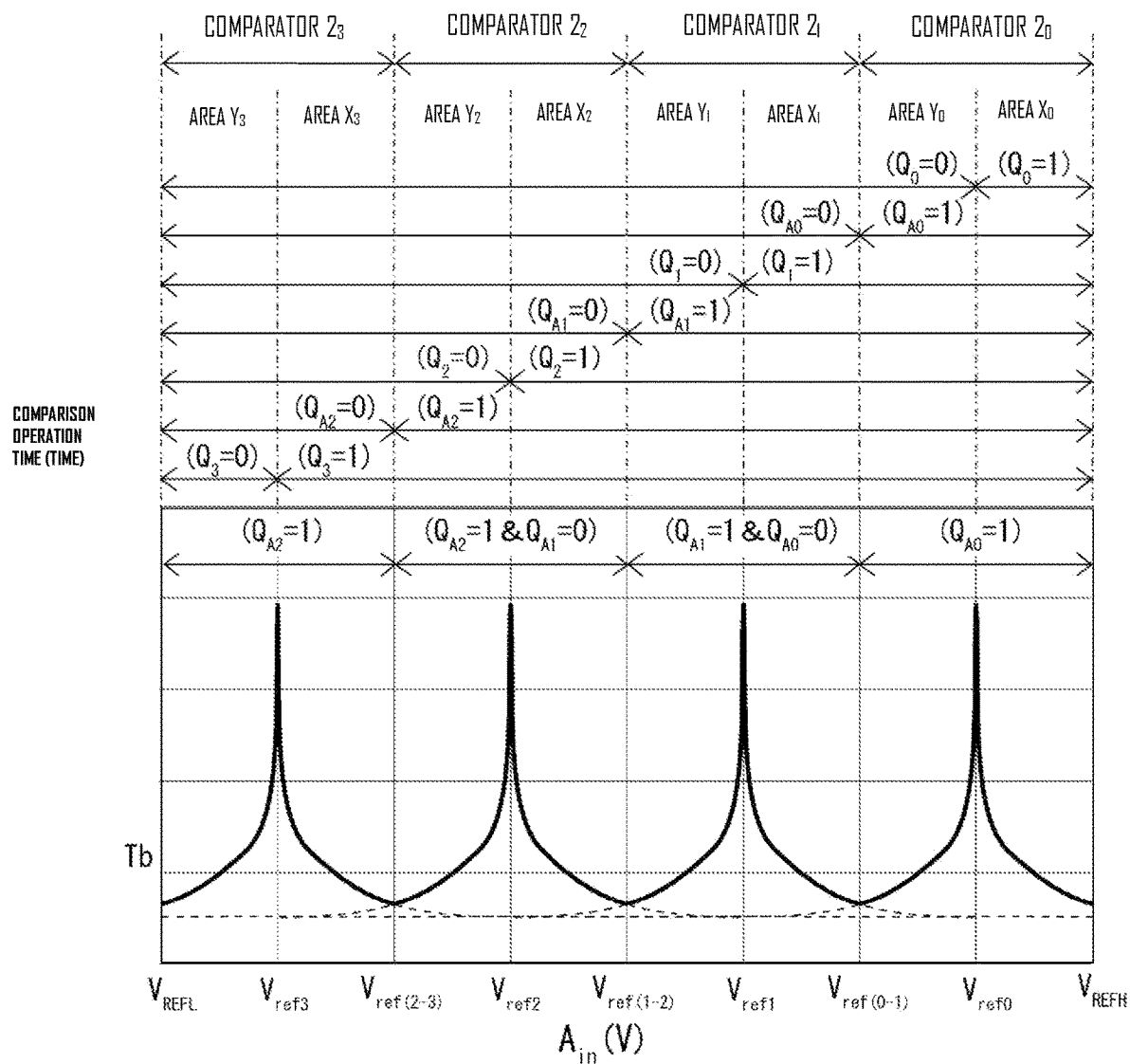

[FIG. 10]
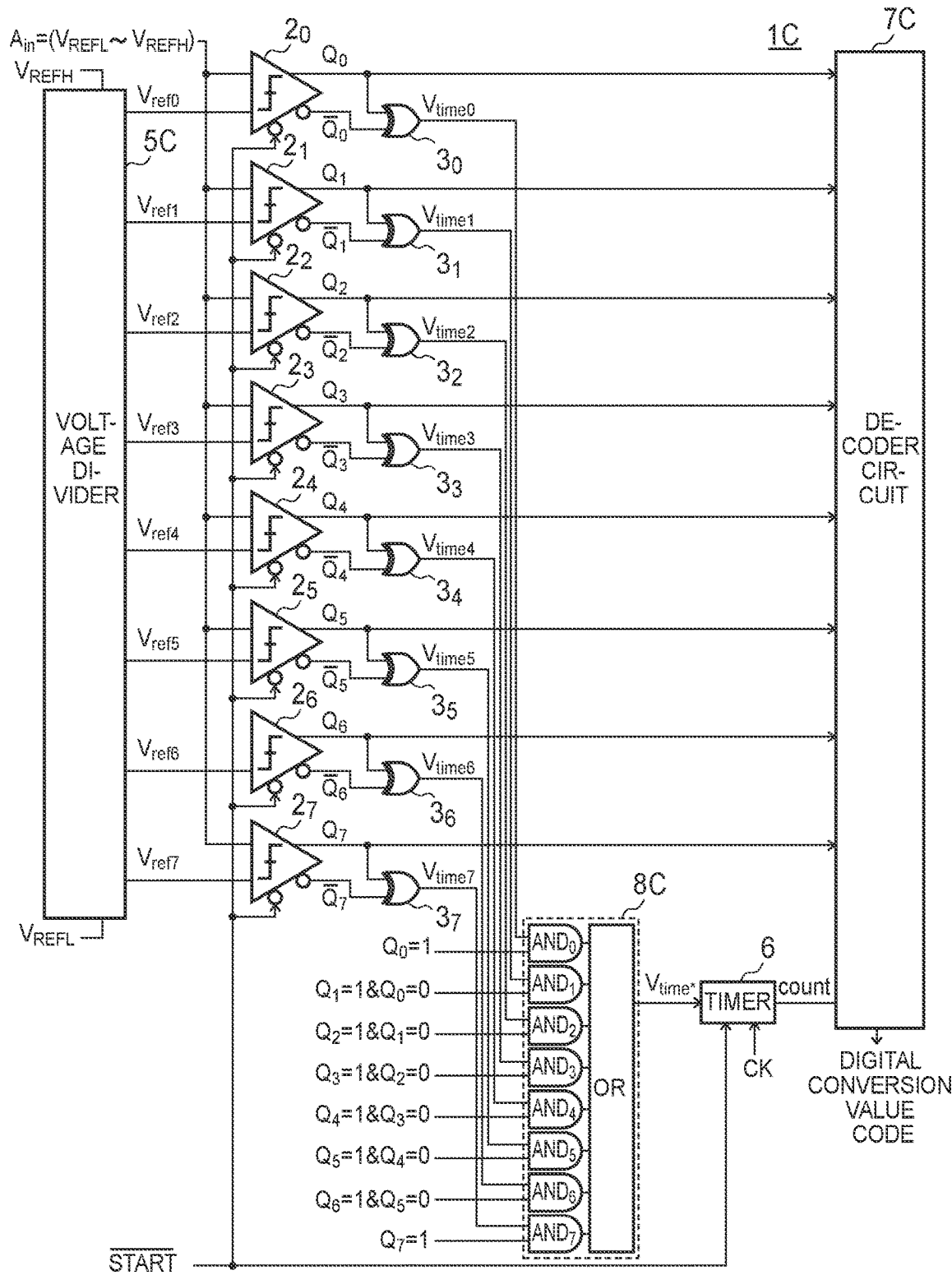

【FIG. 11】
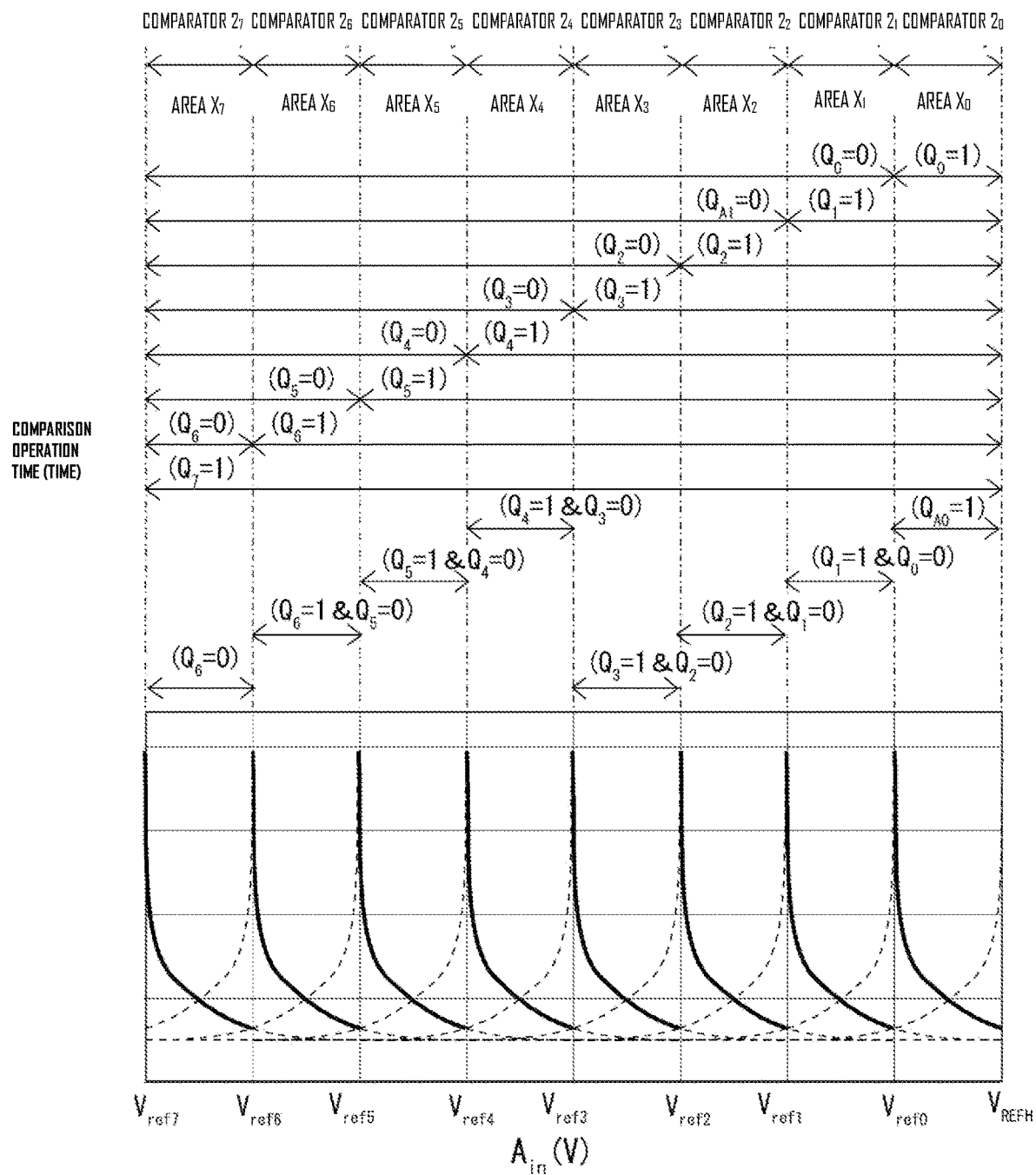

[FIG. 12]
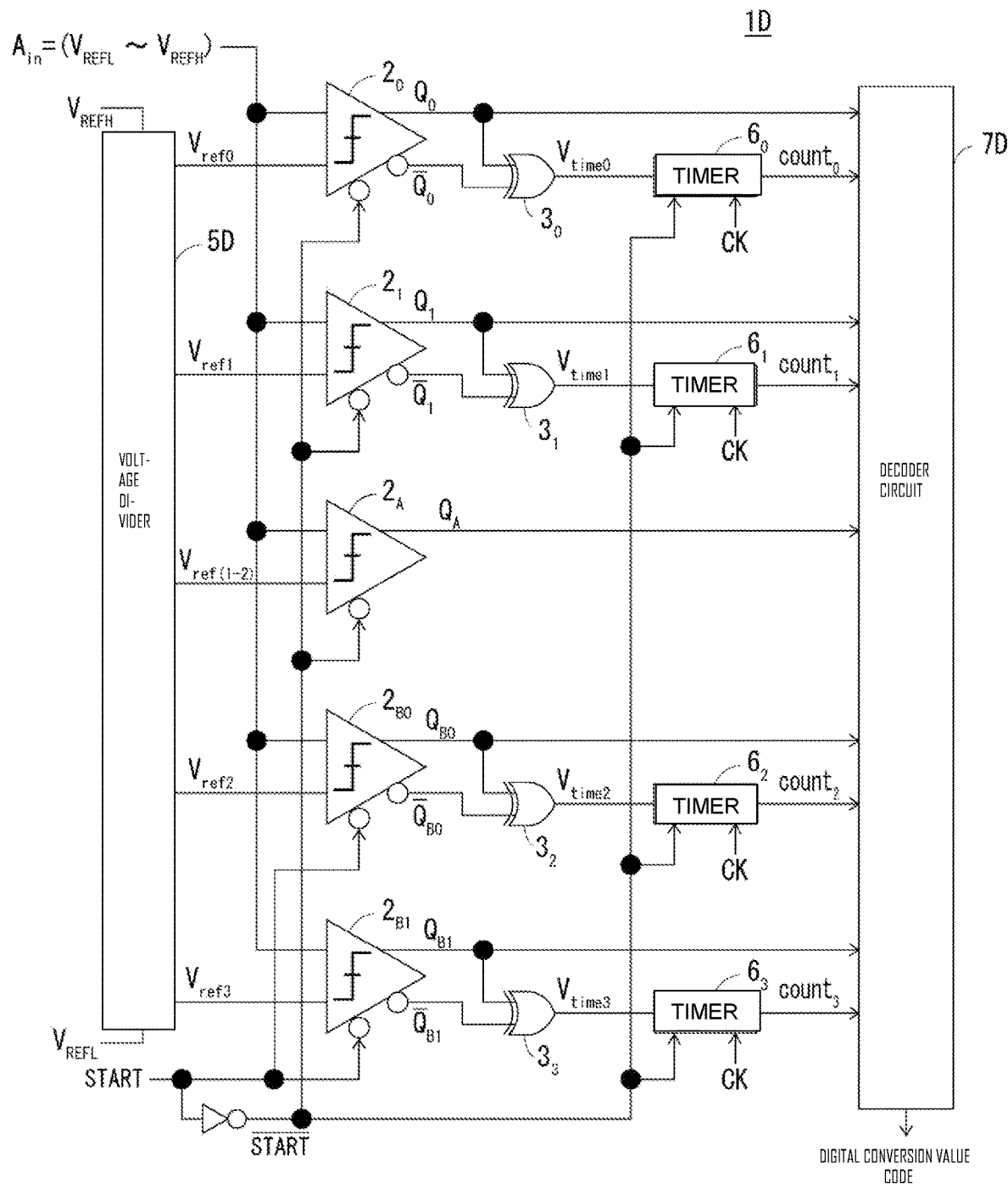

【FIG. 13】
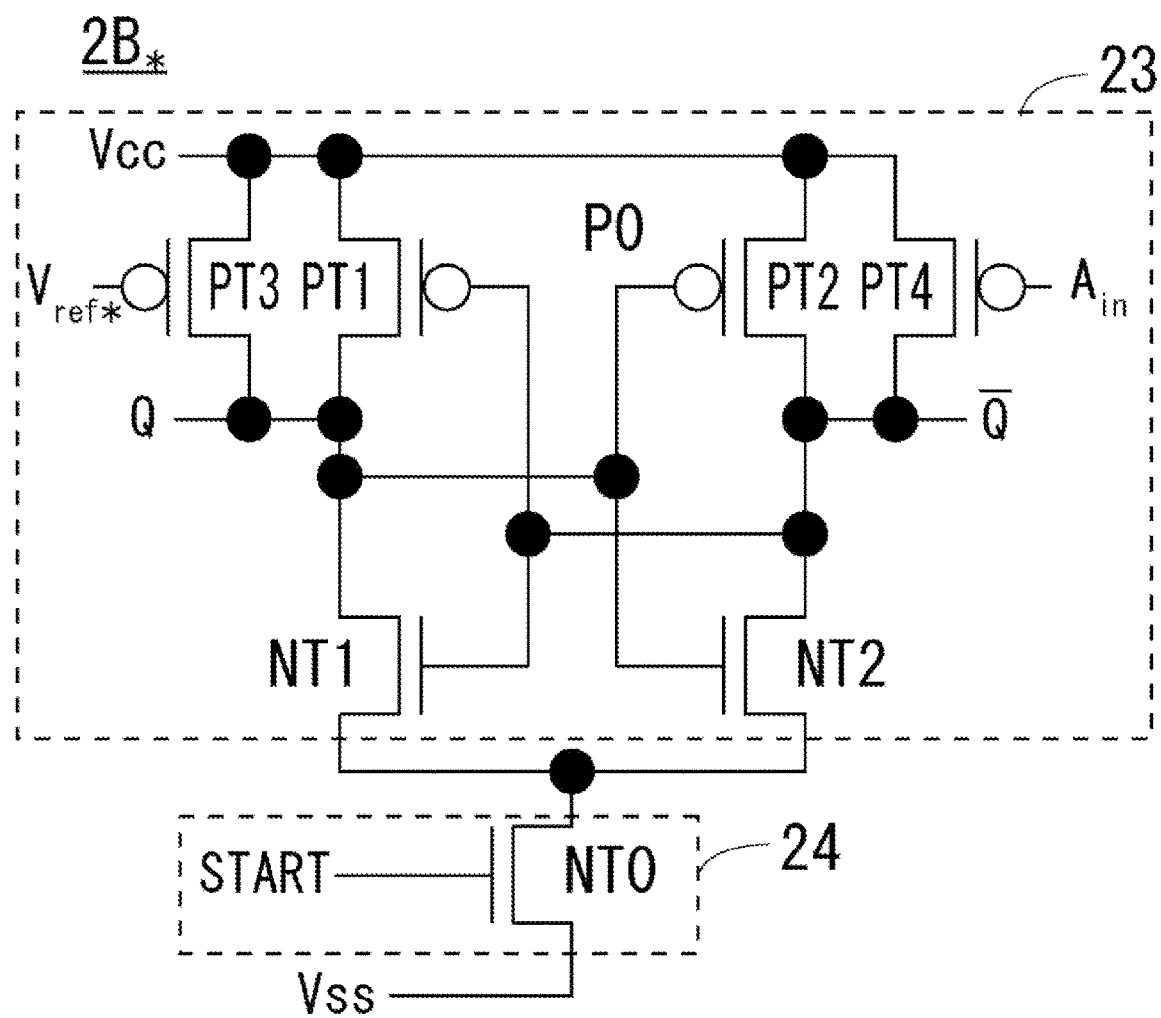

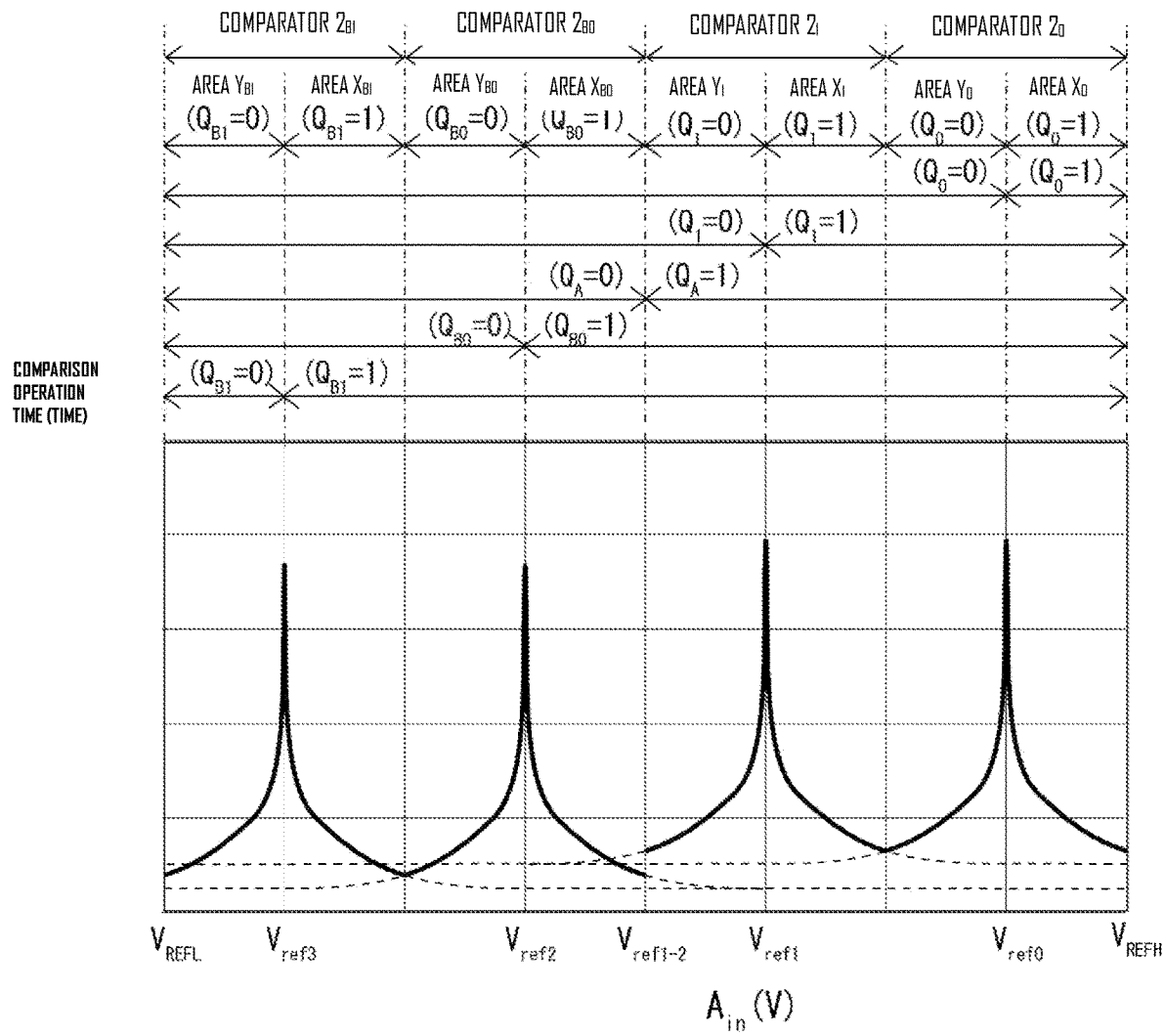
[FIG. 14]

ANALOG-TO-DIGITAL CONVERTER

CROSS REFERENCE TO RELATED APPLICATIONS

This application claims priority based on 35 USC 119 from prior Japanese Patent Application No. 2021-172450 filed with the Japan Patent Office on Oct. 21, 2021, the entire contents of which are incorporated herein by reference.

BACKGROUND

The disclosure relates to an analog-to-digital converter that converts an input analog signal (input analog potential $A_{in}$) into a digital value.

As an analog-to-digital converter (hereinafter referred to as an AD converter) that converts an input analog signal into a digital value, Patent Publication No. JPH01-103320 (Patent Document 1) discloses a flash type AD converter. The flash type AD converter includes ($2^n-1$) comparison potentials and ($2^n-1$) comparators for n bits of resolution. The flash type AD converter obtains a digital value by simultaneously conducting potential comparison for an input analog potential $A_{in}$ with all comparators and checking which of the digital values from 0 to ($2^n-1$) corresponds to the result of the potential comparison.

The advantages of the flash type AD converter are that a digital value for the input analog potential $A_{in}$ can be easily obtained by a single comparator operation, and that high-speed AD conversion can be achieved. Since sampling of the input analog potential $A_{in}$ is not required, the means for sampling (capacitance, switches, and means for controlling the capacitance and switches) are not required, and the time required for sampling is also not required.

As an AD converter, Patent Publication No. JP2002-374169 (Patent Document 2) discloses a successive approximation type AD converter. The successive approximation type AD converter comprises: a CDAC comprising ($2^n$) capacitive elements for n bits of resolution and having a function as a sampling capacitance of the input analog potential $A_{in}$; one comparator; and a control circuit of the CDAC. The successive approximation type AD converter obtains a digital value with comparison operations for n times using the binary search method.

The advantages of the successive approximation type AD converter are that a digital value can be obtained by performing the comparison operations for n times with one comparator, and that the number of circuits, high-speed feature, and power consumption are well-balanced.

As an AD converter, Patent Publication No. JPS62-109434 (Patent Document 3) discloses a Wilkinson type AD converter (also called a voltage-time conversion type AD converter).

The Wilkinson type AD converter comprises a capacitance that charges the input analog potential $A_{in}$ (sampling) and a TDC circuit (Time to Digital Converter). The Wilkinson type AD converter obtains a digital value by disconnecting (holding) capacitance that charges the input analog potential $A_{in}$ (sampling) from the input, extracting the charge stored in the capacitance at a constant current, and measuring the time until the charge becomes zero (becomes 0V) using the TDC circuit.

The advantage of the Wilkinson type AD converter is that the Wilkinson type AD converter is expected to be an AD converter with excellent differential linearity.

However, the flash type AD converter requires a method of obtaining ($2^n-1$) comparison potentials and ($2^n-1$) comparators, which increases the size of the AD converter. For example, 4095 comparison potentials and 4095 comparators are required to be installed in order to obtain a 12-bit resolution in a flash type AD converter.

The successive approximation type AD converter requires ($2^n$) capacitive elements and an analog switch in a CDAC. The capacitive elements and analog switch are elements with large layout areas, which increases the size of the AD converter.

The Wilkinson type AD converter requires a large capacitive element for sampling the input analog potential $A_{in}$, which increases the size of the AD converter. A capacitive element of the Wilkinson type AD converter requires a size that is ($2^n$) times larger than the n-bit resolution of the AD converter, and the size of the capacitance increases exponentially as the resolution is increased.

A digital logic circuit is benefited from miniaturization of elements, and becomes smaller and more integrated; however, an analog circuit (especially elements such as capacitance and resistance) is difficult to miniaturize, and the ratio of an analog circuit area to a chip area is relatively large, which is a factor to push up the price.

In addition, with miniaturization of an MOS device, the increase in leakage current of an MOS switch becomes a problem. Since a successive approximation type AD converter and a Wilkinson type AD converter include a combination of a capacitive element and an MOS switch in a circuit, the increase in error due to leakage current becomes a problem.

There are several types of AD converter methods, including a ramp type, a follow-up type (ramp input type), a VF conversion type, and a delta-sigma type, but instead of not making the size large, these AD converters increase the conversion time.

SUMMARY

An analog-to-digital converter according to one or more embodiments that converts an input analog potential into a digital conversion value may include a comparator that compares the input analog potential with a reference potential and a conversion circuit that measures comparison operation time from the start to the end of a comparison operation by the comparator and outputs the digital conversion value according to the measured comparison operation time and a comparison result by the comparator.

An analog-to-digital converter according to one or more embodiments that converts an input analog potential into a digital conversion value may include comparators that compare the input analog potential with different reference potentials, respectively, and a conversion circuit that outputs the digital conversion value according to comparison operation time from the start to the end of a comparison operation by the comparator identified among the comparators.

BRIEF DESCRIPTION OF DRAWINGS

FIG. 1 is a configuration diagram illustrating a configuration of an AD converter according to a first embodiment;

FIG. 2 is a circuit diagram illustrating a configuration example of a comparator illustrated such as in FIG. 1;

FIGS. 3A, 3B, and 3C are waveform diagrams illustrating operations of the comparator and an end detection circuit illustrated such as in FIG. 1;

FIG. 4 is a diagram illustrating an example of correlation characteristics of the comparator illustrated such as in FIG. 1;

FIGS. 5A, 5B, and 5C are diagrams illustrating examples of calculations of an input analog potential from the comparison operation time in a time measuring circuit illustrated such as in FIG. 1;

FIG. 6 is a configuration diagram illustrating a configuration of an AD converter according to a second embodiment;

FIG. 7 is a diagram illustrating an example of correlation characteristics of a comparator illustrated such as in FIG. 6;

FIG. 8 is a configuration diagram illustrating a configuration of an AD converter according to a third embodiment;

FIG. 9 is a diagram illustrating an example of correlation characteristics of a comparator illustrated such as in FIG. 8;

FIG. 10 is a configuration diagram illustrating a configuration of an AD converter according to a fourth embodiment;

FIG. 11 is a diagram illustrating an example of correlation characteristics of a comparator illustrated such as in FIG. 10;

FIG. 12 is a configuration diagram illustrating a configuration of an AD converter according to a fifth embodiment;

FIG. 13 is a circuit diagram illustrating an example of a configuration of a different type of comparator illustrated such as in FIG. 12; and FIG. 14 is a diagram illustrating an example of correlation characteristics of a comparator illustrated such as in FIG. 12.

DETAILED DESCRIPTION

AD converters according to one or more embodiments are explained with referring to drawings. In the respective drawings referenced herein, the same constituents are designated by the same reference numerals and duplicate explanation concerning the same constituents may be omitted. All of the drawings are provided to illustrate the respective examples only. No dimensional proportions in the drawings shall impose a restriction on the embodiments. For this reason, specific dimensions and the like should be interpreted with the following descriptions taken into consideration. In addition, the drawings include parts whose dimensional relationships and ratios are different from one drawing to another. Asterisks "*" in the specification mean wildcards, which may refer to any single or multiple elements, numbers, symbols, or strings, etc. that may be applicable.

First Embodiment

Referring to FIG. 1, an analog-to-digital converter 1 according to a first embodiment (hereinafter referred to as an AD converter 1) comprises a comparator 2 that compares an input analog potential $A_{in}$ input as an analog signal with a reference potential $V_{ref}$, an end detection circuit 3 that detects the end of a comparison operation by the comparator 2, a time measuring circuit 4 (hereinafter referred to as a TDC circuit 4) that measures comparison operation time from the start to the end of the comparison operation by the comparator 2 and that outputs a digital conversion value CODE according to the measured comparison operation time and a comparison result Q conducted by the comparator 2.

The comparator 2 comprises a first input terminal to which the input analog potential $A_{in}$ of a lower limit reference potential $V_{REFL}$ to an upper limit reference potential $V_{REFH}$ is input, a second input terminal to which the reference potential $V_{ref}$ set to a potential between the lower limit reference potential $V_{REFL}$ and the upper limit reference potential $V_{REFH}$ (a potential in the center of the lower limit reference potential $V_{REFL}$ and the upper limit reference potential $V_{REFH}$ in the disclosure) is input, an output terminal that outputs the comparison result Q of the input analog potential $A_{in}$ and the reference potential $V_{ref}$, an inverted output terminal that outputs an inverted output $\overline{Q}$ of the comparison result Q, and a start signal input terminal to which a start signal $\overline{START}$ is input.

In the comparator 2, the start signal $\overline{START}$ input to the start signal input terminal is a comparison start instruction signal that instructs the comparator 2 to start the comparison, and when the start signal $\overline{START}$ transitions from a high level Hi to a low level Low, the comparator 2 starts a comparison operation of the input analog potential $A_{in}$ input to the first input terminal and the reference potential $V_{ref}$ input to the second input terminal. The comparator 2 outputs "1" (high level Hi) as the comparison result Q from the output terminal when the input analog potential $A_{in}$>the reference potential $V_{ref}$, and outputs "0" (low level Low) as the comparison result Q from the output terminal when the input analog potential $A_{in}$<the reference potential $V_{ref}$.

As illustrated in FIG. 2, for example, the comparator 2 may be configured with a circuit in which a P-channel MOS transistor P0 functioning as a power switch 22 is added to a memory cell 21 of a general CMOS type SRAM. The gate of the P-channel MOS transistor P0 serves as the start signal input terminal of the comparator 2 to which the start signal $\overline{START}$ is input.

The memory cell 21 includes P-channel MOS transistors P1 and P2, and N-channel MOS transistors N1, N2, N3, and N4.

The P-channel MOS transistor P1 and the N-channel MOS transistor N1 comprise a first CMOS inverter. The source of the P-channel MOS transistor P1 is connected to a power supply voltage Vcc via the power switch 22, and the drain of the P-channel MOS transistor P1 is connected to the drain of the N-channel MOS transistor N1. The source of the N-channel MOS transistor N1 is connected to a ground voltage Vss.

The P-channel MOS transistor P2 and the N-channel MOS transistor N2 comprise a second CMOS inverter. The source of the P-channel MOS transistor P2 is connected to the power supply voltage Vcc via the power switch 22, and the drain of the P-channel MOS transistor P2 is connected to the drain of the N-channel MOS transistor N2. The source of the N-channel MOS transistor N2 is connected to the ground voltage Vss.

The input of the first CMOS inverter, that is, the gate of the P-channel MOS transistor P1 and the gate of the N-channel MOS transistor N1, is the output of the second CMOS inverter, that is, being connected to the connection point of the drain of the P-channel MOS transistor P1 and the drain of the N-channel MOS transistor N1, and becoming the inverted output terminal of the comparator 2, which outputs the inverted output $\overline{Q}$ of the comparison result Q.

The input of the second CMOS inverter, that is, the gate of the P-channel MOS transistor P2 and the gate of the N-channel MOS transistor N2, is the output of the first CMOS inverter, that is, being connected to the connection point of the drain of the P-channel MOS transistor P2 and the drain of the N-channel MOS transistor N2, and becoming the output terminal of the comparator 2, which outputs the comparison result Q.

The N-channel MOS transistor N3 is connected in parallel with the N-channel MOS transistor N1, and the gate of the N-channel MOS transistor N3 is the second input terminal of the comparator 2 to which the reference potential $V_{ref}$ is input.

The N-channel MOS transistor N4 is connected in parallel with the N-channel MOS transistor N2, and the gate of the N-channel MOS transistor N4 is the first input terminal of the comparator 2 to which the input analog potential $A_{in}$ is input.

Referring to FIGS. 3A to 3C, when the start signal $\overline{\text{START}}$ is at a high level Hi, the P-channel MOS transistor P0, which is the power switch 22, is turned off, and the comparison result Q and the inverted output $\overline{Q}$ are both "0" (low level Low) regardless of the potentials of the input analog potential $A_{in}$ and the reference potential $V_{ref}$. FIG. 3A illustrates a waveform of the start signal $\overline{\text{START}}$, FIG. 3B illustrates an output waveform of the comparator 2, and FIG. 3C illustrates an output waveform of the end detection circuit 3.

When the start signal $\overline{\text{START}}$ transitions to the low level low, the P-channel MOS transistor P0, which is the power switch 22, is turned on, the power supply voltage Vcc is applied to the memory cell 21, and the comparison operation of the comparator 2 starts. In other words, the time at which the start signal $\overline{\text{START}}$ input to the start signal input terminal of the comparator 2 transitions from the high level Hi to the low level Low is the operation start time at which the comparator 2 starts the comparison operation.

The memory cell 21 to which the power supply voltage Vcc is applied attempts to change from an unstable state in which the comparison result Q=the inverted output $\overline{Q}$ to a stable state in which the comparison result Q≠inverted output $\overline{Q}$. At this time, if the input analog potential $A_{in}$>the reference potential $V_{ref}$, since the current flowing to the ground voltage Vss is larger in the N-channel MOS transistor N4 than in the N-channel MOS transistor N3, the unstable state of the comparison result Q=inverted output $\overline{Q}$ is gradually settled, and the comparison result Q becomes "1" (high level Hi) and the inverted output $\overline{Q}$ becomes "0" (low level Low), which leads to the stable state.

The end detection circuit 3 is a circuit for detecting the end time of the operation of the comparator 2 based on the output of the comparator 2 (comparison result Q and inverted output $\overline{Q}$). The end detection circuit 3 is configured with an exclusive OR circuit, which outputs "0" (low level Low) when the comparison result Q and the inverted output $\overline{Q}$ are equal and "1" (high level Hi) when the comparison result Q and the inverted output $\overline{Q}$ are different, for example. In the example illustrated in FIGS. 3A, 3B and 3C, the time at which an output $V_{time}$ of the end detection circuit 3 transitions from the low level Low to the high level Hi is the operation end time at which the comparison operation of the comparator 2 ends.

The comparison operation time of the comparator 2 is from the time of the comparator 2 starting the comparison operation to the time of the comparator 2 ending the comparison operation. The comparison operation time of the comparator 2 is correlated with a potential difference between the input analog potential $A_{in}$ and the reference potential $V_{ref}$, as illustrated in FIG. 4. The comparison operation time becomes longer as the potential difference between the input analog potential $A_{in}$ and the reference potential $V_{ref}$ is smaller and becomes shorter as the potential difference between the input analog potential $A_{in}$ and the reference potential $V_{ref}$ is bigger. In other words, the comparator 2 whose comparison operation time correlates with the potential difference between the input analog potential $A_{in}$ and the reference potential $V_{ref}$ is used.

The fact that there is a correlation between the comparison operation time and the potential difference between the input analog potential $A_{in}$ and the reference potential $V_{ref}$, which are compared to each other, in a comparator is a feature that may also be seen in a general comparator with an operational amplifier type, etc., for example. Therefore, the comparator 2 according to one or more embodiments is not limited to the configuration illustrated in FIG. 2, as long as there is a correlation between the comparison operation time and the potential difference between the input analog potential $A_{in}$ and the reference potential $V_{ref}$, which are compared to each other.

The TDC circuit 4 is provided with functions for measuring the comparison operation time of the comparator 2 and for calculating the digital conversion value CODE of the input analog potential $A_{in}$ using the measured comparison operation time and the comparison result Q.

The TDC circuit 4 measures the time from the operation start time of the comparator 2 when the start signal $\overline{\text{START}}$ transitions from the high level Hi to the low level Low to the operation end time of the comparator 2 when the output $V_{time}$ of the end detection circuit 3 transitions from the low level Low to the high level Hi as the comparison operation time.

The TDC circuit 4 stores correlation characteristics of the potential difference between the input analog potential $A_{in}$ and the reference potential $V_{ref}$ and the comparison operation time, and calculates the digital conversion value CODE of the input analog potential $A_{in}$ using the correlation characteristics.

When the comparison result Q="1" (high level Hi), the TDC circuit 4 uses the correlation characteristics in the area where the input analog potential $A_{in}$ is greater than the reference potential $V_{ref}$ (area X illustrated in FIG. 4) to obtain the input analog potential $A_{in}$ corresponding to the measured comparison operation time, and calculates the digital conversion value CODE of the obtained input analog potential $A_{in}$ to output.

When the comparison result Q="0" (low level Low), the TDC circuit 4 uses the correlation characteristics in the area where the input analog potential $A_{in}$ is smaller than the reference potential $V_{ref}$ (area Y illustrated in FIG. 4) to obtain the input analog potential $A_{in}$ corresponding to the measured comparison operation time, and calculates the digital conversion value CODE of the obtained input analog potential $A_{in}$ to output.

For example, when the comparison result Q="0" and the measured comparison operation time is "Ta", the TDC circuit 4 uses the correlation characteristics in the area Y to obtain the input analog potential $A_{in}$="Va" corresponding to the measured comparison operation time="Ta", and calculates the digital conversion value CODE of the obtained input analog potential $A_{in}$="Va" to output.

In the TDC circuit 4, the method of obtaining the input analog potential $A_{in}$ from the measured comparison operation time may be achieved by storing the correlation characteristics of the comparison operation time and the input analog potential $A_{in}$ as a look-up table or function illustrated in FIG. 5A. When storing the correlation characteristics as a function, a linear approximation divided by some threshold values may be used as illustrated in FIG. 5B, or a logarithmic approximation divided by some threshold values may be used as illustrated in FIG. 5C.

In the case of the comparator 2 illustrated in FIG. 2, if the circuit is designed to be excessively fast, the change in the comparison operation time with respect to the input analog potential $A_{in}$ becomes small, and the resolution during AD conversion becomes rough. Therefore, in order to achieve fine resolution, the comparator 2 may be designed to have the moderately long comparison operation time. The comparison operation time of the comparator 2 may be lengthened by reducing a drain current Ids with N-channel MOS transistors N3 and N4 (reducing W of a shape ratio W/L and increasing L). The comparison operation time of the comparator 2 may also be lengthened by uniformly reducing the drain current Ids between the P-channel MOS transistors P1 and P2 and the N-channel MOS transistors N1, N2, N3 and N4, or by adding capacitance to nodes of the output terminal and the inverted output terminal.

In the case of the comparator 2 illustrated in FIG. 2, the smaller the potential difference between the input analog potential $A_{in}$ and the reference potential $V_{ref}$ becomes, the larger the change in the comparison operation time for the input analog potential $A_{in}$ becomes. The larger the potential difference between the input analog potential $A_{in}$ and the reference potential $V_{ref}$ becomes, the smaller the change in the comparison operation time for the input analog potential $A_{in}$ becomes. Accordingly, the AD converter 1 has the problem that the AD converter 1 is difficult to use unless the change in comparison operation time for the input analog potential $A_{in}$ is large and the input analog potential $A_{in}$ is in the vicinity of the reference potential $V_{ref}$. The second embodiment described below solves this problem.

Second Embodiment

Referring to FIG. 6, an AD converter 1A of a second embodiment comprises: a voltage divider 5A that generates reference potentials $V_{ref0}$ to $V_{ref3}$, which differ between the lower limit reference potential $V_{REFL}$ and the upper limit reference potential $V_{REFH}$; comparators $2_0$ to $2_3$ that compare the input analog potential $A_{in}$ with each of the reference potentials $V_{ref0}$ to $V_{ref3}$; end detection circuits $3_0$ to $3_3$ that detect the end of each of the comparison operations by comparators $2_0$ to $2_3$; timers $6_0$ to $6_3$ that measure the comparison operation time of each of the comparators $2_0$ to $2_3$; and a decoder circuit 7A that outputs the digital conversion value CODE of the input analog potential $A_{in}$ calculated based on a measured value count* selected from measured values $count_0$ to $count_3$ of the respective timers $6_0$ to $6_3$ (hereinafter, * indicates one of the choices) and a comparison result Q* of a comparator 2* specified among comparison results $Q_0$ to $Q_3$ of the comparators $2_0$ to $2_3$.

Referring to FIG. 7, the comparison operation time (measured value) of the comparators $2_0$ to $2_3$ correlates with the respective potential differences between the input analog potential $A_{in}$ and the reference potentials $V_{ref0}$ to $V_{ref3}$. The smaller each of the potential differences between the input analog potential $A_{in}$ and the reference potentials $V_{ref0}$ to $V_{ref3}$ becomes, the larger the change in the comparison operation time (measured value) for the input analog potential $A_{in}$ becomes. The voltage divider 5A generates the reference potentials $V_{ref0}$ to $V_{ref3}$ to make the areas, where the change in the comparison operation time for the input analog potential $A_{in}$ in the respective correlation characteristics of the comparators $2_0$ to $2_3$ is sufficiently large, overlap.

Therefore, the entire measurement range of the AD converter 1A (the lower limit reference potential $V_{REFL}$ to the upper limit reference potential $V_{REFH}$) may be an area where the change in the comparison operation time for the input analog potential $A_{in}$ is sufficiently large. The number of the reference potential $V_{ref}$, the comparator 2, and the end detection circuit 3 may be set as appropriate according to the measurement range, the required accuracy, etc.

The voltage divider 5A may be configured with a divider resistor, but the resistor may be an element with a large variation and a large layout size. Therefore, it may be suitable for the voltage divider 5A to be configured with a MOS element or a diode element so as to have high accuracy and a reduced layout size.

The timers $6_0$ to $6_3$ are input with outputs $V_{time0}$ to $V_{time3}$ of the respective outputs of the end detection circuits $3_0$ to $3_3$, the start signal $\overline{START}$, and a clock signal CK. The timers $6_0$ to $6_3$ calculate the measured values $count_0$ to $count_3$ from the operation start time of the comparators $6_0$ to $6_3$ when the start signal $\overline{START}$ transitions from the high level Hi to the low level Low to the operation end time when the outputs $V_{time0}$ to $V_{time3}$ of the respective end detection circuits $3_0$ to $3_3$ transition from the low level Low to the high level Hi as the comparison operation time of each of the comparators $2_0$ to $2_3$, and output to the decoder circuit 7A.

As illustrated in FIG. 7, the decoder circuit 7A stores the correlation characteristics of the potential differences between the input analog potential $A_{in}$ and each of the reference potentials $V_{ref0}$ to $V_{ref3}$ and the comparison operation time (measured value) of the comparators $2_0$ to $2_3$, respectively. The decoder circuit 7A selects the largest measured value count* among the measured values $count_0$ to $count_3$ and identifies the comparator 2* with the largest comparison operation time. The decoder circuit 7A calculates the digital conversion value CODE of the input analog potential $A_{in}$ based on the comparison result Q* of the identified comparator 2* and the selected measured value count* by using the correlation characteristics of the identified comparator 2*.

For example, when the unknown input analog potential $A_{in}$ is Vb illustrated in FIG. 7, the output $V_{time2}$ of the end detection circuit $3_2$ transitions from the latest low level Low to the high level Hi, and the decoder circuit 7A selects the measured value $count_2$=Tb measured by the timer $6_2$. The decoder circuit 7A also specifies the comparator $2_2$ with the largest comparison operation time.

When the comparison result Q* of the specified comparator 2*="1" (high level Hi), the decoder circuit 7A uses the correlation characteristics in the area where the input analog potential $A_{in}$ of the specified comparator 2* is greater than the reference potential $V_{ref}$* (area X* illustrated in FIG. 7) to obtain the input analog potential $A_{in}$ corresponding to the selected comparison operation time (measured value) and calculates the digital conversion value CODE of the obtained input analog potential $A_{in}$ to output.

When the comparison result Q* of the specified comparator 2*="0" (low level Low), the decoder circuit 7A uses the correlation characteristics in the area where the input analog potential $A_{in}$ of the specified comparator 2* is smaller than the reference potential $V_{ref}$* (area Y* illustrated in FIG. 7) to obtain the input analog potential $A_{in}$ corresponding to the selected comparison operation time (measured value) and calculates the digital conversion value CODE of the obtained input analog potential $A_{in}$ to output.

For example, when the comparison result $Q_2$ of the identified comparator 2*="0" and the selected maximum comparison operation time (measured value $count_2$) is "Tb", the decoder circuit 7A uses the correlation characteristics in the area Y2 to obtain the input analog potential $A_{in}$="Vb" corresponding to the measured comparison operation time="Tb" and calculates the digital conversion value CODE of the obtained input analog potential $A_{in}$="Vb" to output.

Third Embodiment

Referring to FIG. 8, an AD converter 1B according to a third embodiment comprises: a voltage divider 5B that generates different reference potentials $V_{ref0}$ to $V_{ref3}$, an intermediate potential $V_{ref(0-1)}$ of reference potentials $V_{ref0}$-$V_{ref1}$, an intermediate potential $V_{ref(1-2)}$ of reference potentials $V_{ref1}$-$V_{ref2}$, and an intermediate potential $V_{ref(2-3)}$ of reference potentials $V_{ref2}$-$V_{ref3}$ between the lower limit reference potential $V_{REFL}$ and the upper limit reference potential $V_{REFH}$; the comparators $2_0$ to $2_3$ that compare the input analog potential $A_{in}$ with each of the reference potentials $V_{ref0}$ to $V_{ref3}$, comparators $2_{A0}$ to $2_{A2}$ that compare the input analog potential $A_{in}$ with the intermediate potential $V_{ref(0-1)}$, $V_{ref(1-2)}$, and $V_{ref(2-3)}$, respectively; end detection circuits $3_0$ to $3_3$ that detect the end of the comparison operation time of the respective comparators $2_0$ to $2_3$; a selection circuit 8B that selects one of the comparators $2_0$ to $2_3$; the timer 6 that measures the comparison operation time of the comparator 2* selected by the selection circuit 8B; and a decoder circuit 7B that outputs the digital conversion value CODE of the input analog potential $A_{in}$ calculated based on the measured value, count, of the timer 6 and the comparison result Q* of the comparator 2* specified among the comparators $2_0$ to $2_3$.

The selection circuit 8B selects one of the comparators $2_0$ to $2_3$ based on the comparison results $Q_{A0}$ to $Q_{A2}$ of the comparators $2_{A0}$ to $2_{A2}$. The selection circuit 8B is provided with AND circuits $AND_0$ to $AND_3$ and an OR circuit OR.

Any structure may be applied to the comparators $2_{A0}$ to $2_{A2}$, but a structure that operates at higher speed than comparators $2_0$ to $2_3$ may be used.

In the AND circuit $AND_0$, the comparison result $Q_{A0}$ of the comparator $2_{A0}$ is input as a selection signal for the output $V_{time0}$ of the end detection circuit $3_0$. When the comparison result $Q_{A0}$ of the comparator $2_{A0}$ is "1", the output $V_{time0}$ of the end detection circuit $3_0$ is input to the timer 6 via the OR circuit OR.

In the AND circuit $AND_1$, the signal which becomes "1" with the comparison result $Q_{A1}$ of the comparator $2_{A1}$="1" and the comparison result $Q_{A0}$ of the comparator $2_{A0}$="0" (other combinations become "0") is input as a selection signal for the output $V_{time1}$ of the end detection circuit $3_1$. When the comparison result $Q_{A1}$ of the comparator $2_{A1}$="1" and the comparison result $Q_{A0}$ of the comparator $2_{A0}$="0", the output $V_{time1}$ of the end detection circuit $3_1$ is input to the timer 6 via the OR circuit OR.

In the AND circuit $AND_2$, the signal which becomes "1" with the comparison result $Q_{A2}$ of the comparator $2_{A2}$="1" and the comparison result $Q_{A1}$ of the comparator $2_{A1}$="0" (other combinations become "0") is input as a selection signal for the output $V_{time2}$ of the end detection circuit $3_2$. When the comparison result $Q_{A2}$ of the comparator $2_{A2}$="1" and the comparison result $Q_{A1}$ of the comparator $2_{A1}$="0", the output $V_{time2}$ of the end detection circuit $3_2$ is input to the timer 6 via the OR circuit OR.

In the AND circuit $AND_3$, a signal inverted from the comparison result $Q_{A2}$ of the comparator $2_{A2}$ is input as a selection signal for the output $V_{time3}$ of the end detection circuit $3_3$. When the comparison result $Q_{A0}$ of the comparator $2_{A0}$ is "0", the output $V_{time3}$ of the end detection circuit $3_3$ is input to the timer 6 via the OR circuit OR.

Thus, when the input analog potential $A_{in}$ exceeds the intermediate potential $V_{ref(0-1)}$, the selection circuit 8B selects the comparator $2_0$, and the comparison operation time of the comparator $2_0$ is measured by the timer 6. When the input analog potential $A_{in}$ is between the intermediate potentials $V_{ref(0-1)}$ and $V_{ref(1-2)}$, the selection circuit 8B selects the comparator $2_1$, and the comparison operation time of the comparator $2_1$ is measured by the timer 6. When the input analog potential $A_{in}$ is between the intermediate potentials $V_{ref(1-2)}$ and $V_{ref(2-3)}$, the selection circuit 8B selects the comparator $2_2$, and the comparison operation time of the comparator $2_2$ is measured by the timer 6. When the input analog potential $A_{in}$ is below the intermediate potential $V_{ref(2-3)}$, the selection circuit 8B selects the comparator $2_3$, and the comparison operation time of the comparator $2_3$ is measured by the timer 6.

As illustrated in FIG. 9, the decoder circuit 7B stores the correlation characteristics of the potential differences between the input analog potential $A_{in}$ and the respective reference potentials $V_{ref0}$ to $V_{ref3}$ and the comparison operation time (measured value) in the comparators $2_0$ to $2_3$, respectively. The decoder circuit 7B uses the correlation characteristics of the comparator 2* identified by the same logic as the selection circuit 8B to output the digital conversion value CODE of the input analog potential $A_{in}$ calculated based on the comparison result Q* of the identified comparator 2* and the measured value, count, of the timer 6.

Fourth Embodiment

Referring to FIG. 10, an AD converter 1C according to a fourth embodiment comprises: a voltage divider 5C that generates different reference potentials $V_{ref0}$ to $V_{ref7}$ between the lower limit reference potential $V_{REFL}$ and the upper limit reference potential $V_{REFH}$; comparators $2_0$ to $2_7$ that compare the input analog potential $A_{in}$ with each of the reference potentials $V_{ref0}$ to $V_{ref7}$; end detection circuits $3_0$ to $3_7$ that detect the end of the respective comparison operations by the comparators $2_0$ to $2_7$; a selection circuit 8C that selects one of the comparators $2_0$ to $2_7$; the timer 6 that measures the comparison operation time selected by the selection circuit 8C; and a decoder circuit 7C that outputs the digital conversion value CODE of the input analog potential $A_{in}$ calculated based on the measured value, count, of the timer 6 and the comparison result Q* of the comparator 2* identified among the comparators $2_0$ to $2_7$.

The selection circuit 8C selects one of the comparators $2_0$ to $2_7$ based on the comparison results $Q_0$ to $Q_7$ of the comparators $2_0$ to $2_7$. The selection circuit 8C is provided with AND circuits $AND_0$ to $AND_7$ and an OR circuit OR.

In the AND circuit $AND_0$, the comparison result $Q_0$ of the comparator $2_0$ is input as a selection signal for the output $V_{time0}$ of the end detection circuit $3_0$. When the comparison result $Q_0$ of the comparator $2_0$ is "1", the output $V_{time0}$ of the end detection circuit $3_0$ is input to the timer 6 via the OR circuit OR.

In the AND circuit $AND_1$, the signal that becomes "1" with the comparison result $Q_1$ of the comparator $2_1$="1" and the comparison result $Q_0$ of the comparator $2_0$="0" (other combinations become "0") is input as a selection signal for the output $V_{time1}$ of the end detection circuit $3_1$. When the comparison result $Q_1$ of the comparator $2_1$="1" and the comparison result $Q_0$ of the comparator $2_0$="0", the output $V_{time1}$ of the end detection circuit $3_1$ is input to the timer 6 via the OR circuit OR.

In the AND circuit $AND_2$, the signal that becomes "1" with the comparison result $Q_2$ of the comparator $2_2$="1" and the comparison result $Q_1$ of the comparator $2_1$="0" (other combinations become "0") is input as a selection signal for the output $V_{time2}$ of the end detection circuit $3_2$. When the comparison result $Q_2$ of the comparator $2_2$="1" and the comparison result $Q_1$ of the comparator $2_1$="0", the output $V_{time2}$ of the end detection circuit $3_2$ is input to the timer 6 via the OR circuit OR.

In the AND circuit $AND_3$, the signal that becomes "1" with the comparison result $Q_3$ of the comparator $2_3$="1" and the comparison result $Q_2$ of the comparator $2_2$="0" (other combinations become "0") is input as a selection signal for the output $V_{time3}$ of the end detection circuit $3_3$. When the comparison result $Q_3$ of the comparator $2_3$="1" and the comparison result $Q_2$ of the comparator $2_2$="0", the output $V_{time3}$ of the end detection circuit $3_3$ is input to the timer 6 via the OR circuit OR.

In the AND circuit $AND_4$, the signal that becomes "1" with the comparison result $Q_4$ of the comparator $2_4$="1" and the comparison result $Q_3$ of the comparator $2_3$="0" (other combinations become "0") is input as a selection signal for the output $V_{time4}$ of the end detection circuit $3_4$. When the comparison result $Q_4$ of the comparator $2_4$="1" and the comparison result $Q_3$ of the comparator $2_3$="0", the output $V_{time4}$ of the end detection circuit $3_4$ is input to the timer 6 via the OR circuit OR.

In the AND circuit $AND_5$, the signal that becomes "1" with the comparison result $Q_5$ of the comparator $2_5$="1" and the comparison result $Q_4$ of the comparator $2_4$="0" (other combinations become "0") is input as a selection signal for the output $V_{time5}$ of the end detection circuit $3_5$. When the comparison result $Q_5$ of the comparator $2_5$="1" and the comparison result $Q_4$ of the comparator $2_4$="0", the output $V_{time5}$ of the end detection circuit $3_6$ is input to the timer 6 via the OR circuit OR.

In the AND circuit $AND_5$, the signal that becomes "1" with the comparison result $Q_6$ of the comparator $2_6$="1" and the comparison result $Q_6$ of the comparator $2_5$="0" (other combinations become "0") is input as a selection signal for the output $V_{time6}$ of the end detection circuit $3_6$. When the comparison result $Q_6$ of the comparator $2_6$="1" and the comparison result $Q_6$ of the comparator $2_5$="0", the output $V_{time6}$ of the end detection circuit $3_6$ is input to the timer 6 via the OR circuit OR.

In the AND circuit $AND_5$, a signal inverted from the comparison result $Q_6$ of the comparator $2_6$ is input as a selection signal for the output $V_{time7}$ of the end detection circuit $3_7$. When the comparison result $Q_7$ of the comparator $2_7$ is "0", the output $V_{time7}$ of the end detection circuit $3_7$ is input to the timer 6 via the OR circuit OR.

Thus, when the input analog potential $A_{in}$ exceeds the reference potential $V_{ref0}$, the selection circuit 8C selects the comparator $2_0$, and the comparison operation time of the comparator $2_0$ is measured by the timer 6. When the input analog potential $A_{in}$ is between the reference potential $V_{ref0}$ and $V_{ref1}$, the selection circuit 8C selects the comparator $2_1$, and the comparison operation time of the comparator $2_1$ is measured by the timer 6. When the input analog potential $A_{in}$ is between the reference potential $V_{ref1}$ and $V_{ref2}$, the selection circuit 8C selects the comparator $2_2$, and the comparison operation time of the comparator $2_2$ is measured by the timer 6. When the input analog potential $A_{in}$ is between the reference potential $V_{ref2}$ and $V_{ref3}$, the selection circuit 8C selects the comparator $2_3$, and the comparison operation time of the comparator $2_3$ is measured by the timer 6. When the input analog potential $A_{in}$ is between the reference potential $V_{ref3}$ and $V_{ref4}$, the selection circuit 8C selects the comparator 24, and the comparison operation time of the comparator 24 is measured by the timer 6. When the input analog potential $A_{in}$ is between the reference potential $V_{ref4}$ and $V_{ref5}$, the selection circuit 8C selects the comparator $2_5$, and the comparison operation time of the comparator $2_5$ is measured by the timer 6. When the input analog potential $A_{in}$ is between the reference potential $V_{ref5}$ and $V_{ref6}$, the selection circuit 8C selects the comparator $2_6$, and the comparison operation time of the comparator $2_6$ is measured by the timer 6. When the input analog potential $A_{in}$ is below the reference potential $V_{ref6}$, the selection circuit 8C selects the comparator $2_7$, and the comparison operation time of the comparator $2_7$ is measured by the timer 6.

As illustrated in FIG. 11, the decoder circuit 7C stores the respective correlation characteristics of the potential differences between the input analog potential $A_{in}$ and each of the reference potentials $V_{ref0}$ to $V_{ref7}$ and the comparison operation time (measured value) in the comparators $2_0$ to $2_7$. The decoder circuit 7C uses the correlation characteristics of the comparator 2* identified by the same logic as the selection circuit 8C to output the digital conversion value CODE of the input analog potential $A_{in}$ calculated based on the measured value, count, of the timer 6.

As illustrated in FIG. 11, the decoder circuit 7C uses only the correlation characteristics in the area where the input analog potential $A_{in}$ is greater than the reference potential $V_{ref}$* (region X* illustrated in FIG. 7). In this case, after the comparator 2* is identified, the digital conversion value CODE may be calculated based on the measured value, count, of the timer 6 without using the comparison result $Q_B$*. Only the correlation characteristics in the area where the input analog potential $A_{in}$ is smaller than the reference potential $V_{ref}$* (area Y* shown in FIG. 7) may also be used.

Fifth Embodiment

Referring to FIG. 12, an AD converter 1D according to a fifth embodiment comprises: a voltage divider 5D that generates different reference potentials $V_{ref0}$ to $V_{ref3}$ and an intermediate potential $V_{ref(1-2)}$ of the reference potentials $V_{ref1}$ and $V_{ref2}$ between the lower limit reference potential $V_{REFL}$ and the upper limit reference potential $V_{REFH}$; comparators $2_0$ to $2_1$ that compare the input analog potential $A_{in}$ with each of the reference potentials $V_{ref0}$ to $V_{ref1}$; a comparator $2_A$ that compares the input analog potential $A_{in}$ with the intermediate potential $V_{ref(1-2)}$; comparators $2_{B0}$ to $2_{B1}$ that compare the input analog potential $A_{in}$ with each of the reference potentials $V_{ref2}$ to $V_{ref3}$; end detection circuits $3_0$ to $3_3$ that detect the end of the respective comparison operations by each of the comparators $2_0$ to $2_1$ and the comparators $2_{B0}$ to $2_{B1}$; timers $6_0$ to $6_3$ that measure the comparison operation time of each of the comparators $2_0$ to $2_1$ and the comparators $2_{B0}$ to $2_{B1}$; and a decoder circuit 7D that outputs the digital conversion value CODE based on the comparator $2_A$, the count* selected from the measured values $count_0$ to $count_3$ of the timers $6_0$ to $6_3$, and the comparison result Q* of the comparator 2* identified among the comparison results $Q_0$ to $Q_1$ of the comparators $2_0$ to $2_1$ and the comparison results $Q_{B0}$ to $Q_{B1}$ of the comparators $2_{B0}$ to $2_{B1}$.

As in the AD converter 1A according to a second embodiment, in the condition of the comparators $2_0$ to $2_3$ having the structure of a CMOS-type SRAM and the power supply (power supply voltage Vcc and ground voltage Vss) being a single power supply identical to the reference power supply of the AD conversion (upper limit reference potential $V_{REFH}$ and lower limit reference potential $V_{REFL}$), when both the input analog potential $A_{in}$ and the reference potential $V_{ref3}$ are low, the P channel MOS transistors P1 and P2 may not be able to be turned on sufficiently, and the circuit becomes unstable.

Therefore, the AD converter 1D uses the comparators $2_{B0}$ to $2_{B1}$ having the structure of the PMOS-type SRAM for AD conversion in the area where the input analog potential $A_{in}$ is low.

As illustrated in FIG. 13, a comparator $2_B$* comprises a circuit in which an N-channel MOS transistor NT0 that functions as a power switch 24 is added to a memory cell 23 of a general PMOS type SRAM. The gate of the N-channel MOS transistor NT0 is a start signal input terminal of the comparator $2_B^*$ to which a start signal START is input.

The memory cell 23 includes N-channel MOS transistors NT1 and NT2, and P-channel MOS transistors PT1, PT2, PT3, and PT4.

The P-channel MOS transistor PT1 and the N-channel MOS transistor NT1 comprise a first CMOS inverter. The source of the N-channel MOS transistor NT1 is connected to the ground voltage Vss via the power switch 24, and the drain of the N-channel MOS transistor NT1 is connected to the drain of the P-channel MOS transistor PT1. The source of the P-channel MOS transistor PT1 is connected to the power supply voltage Vcc.

The P-channel MOS transistor PT2 and the N-channel MOS transistor NT2 comprise a second CMOS inverter. The source of the N-channel MOS transistor NT2 is connected to the ground voltage Vss via the power switch 24, and the drain of the N-channel MOS transistor NT2 is connected to the drain of the P-channel MOS transistor PT2. The source of the P-channel MOS transistor PT2 is connected to the power supply voltage Vcc.

The input of the first CMOS inverter, that is, the gate of the P-channel MOS transistor PT1 and the gate of the N-channel MOS transistor NT1, are the output of the second CMOS inverter, that is, being connected to the connection point of the drain of the P-channel MOS transistor PT1 and the drain of the N-channel MOS transistor NT1, and becoming an inverted output terminal of the comparator $2_B^*$ which outputs an inverted output $\overline{Q_B}^*$ of the comparison result QB.

The input of the second CMOS inverter, that is, the gate of the P-channel MOS transistor PT2 and the gate of the N-channel MOS transistor NT2, are the output of the first CMOS inverter, that is, being connected to the connection point of the drain of the P-channel MOS transistor PT2 and the drain of the N-channel MOS transistor NT2, and becoming an output terminal of the comparator $2_B^*$ which outputs the comparison result $Q_B^*$.

The P-channel MOS transistor PT3 is connected in parallel with the P-channel MOS transistor PT1, and the gate of the P-channel MOS transistor PT3 becomes a second input terminal of the comparator $2_B^*$ to which the reference potential $V_{ref}^*$ is input.

The P-channel MOS transistor PT4 is connected in parallel with the P-channel MOS transistor PT2, and the gate of the P-channel MOS transistor PT4 becomes a first input terminal of the comparator $2_B^*$ to which the input analog potential $A_{in}$ is input.

Referring to FIG. 14, the comparison operation time of the comparators $2_0$ to $2_1$ and the comparators $2_{B0}$ to $2_{B1}$ correlates with the respective potential differences between the input analog potential $A_{in}$ and the reference potentials $V_{ref0}$ to $V_{ref3}$. The smaller each of the respective potential differences between the input analog potential $A_{in}$ and the reference potentials $V_{ref0}$ to $V_{ref3}$ becomes, the larger the change in the comparison operation time for the input analog potential $A_{in}$ becomes. The voltage divider 5D generates the reference potentials $V_{ref0}$ to $V_{ref3}$ make the areas, where the change in the comparison operation time for the input analog potential $A_{in}$ is sufficiently large in the respective correlation characteristics of the comparators $2_0$ to $2_3$, overlap.

In the condition of which all comparators are configured with the comparator $2_B^*$, when both the input analog potential $A_{in}$ and the reference potential $V_{ref0}$ are high, the N-channel MOS transistors NT1 and NT2 may not be able to be turned on sufficiently, and the circuit becomes unstable.

As illustrated in FIG. 14, the correlation characteristics of the comparison operation time and the potential differences are different between the comparators $2_0$ to $2_1$ and the comparators $2_{B0}$ to $2_{B1}$. Therefore, the decoder circuit 7D selects one of the comparators $2_0$ to $2_1$ and the comparators $2_{B0}$ to $2_{B1}$ based on the comparison result $Q_A$ output from the comparator $2_A$, which compares the input analog potential $A_{in}$ with the intermediate potential $V_{ref(1-2)}$.

When the comparison result $Q_A$ of the comparator $2_A$="1" (high level Hi), the decoder circuit 7D selects the largest measured value count* among the measured values $count_0$ to $count_3$ of the comparison operation time of the comparators $2_0$ to $2_1$ and identifies the comparator 2* with the largest comparison operation time. The decoder circuit 7D uses the correlation characteristics of the identified comparator 2* and calculates the digital conversion value CODE of the input analog potential $A_{in}$ based on the comparison result Q* of the identified comparator 2* and the selected measured value count*.

When the comparison result Q* of the identified comparator 2*="1" (high level Hi), the decoder circuit 7D uses the correlation characteristics in the area where the input analog potential $A_{in}$ of the identified comparator 2* is greater than the reference potential $V_{ref}^*$ (area X* shown in FIG. 14) to obtain the input analog potential $A_{in}$ corresponding to the selected comparison operation time (measured value) and calculates the digital conversion value CODE of the obtained input analog potential $A_{in}$ to output.

When the comparison result Q* of the identified comparator 2*="0" (low level Low), the decoder circuit 7 uses the correlation characteristics in the area where the input analog potential $A_{in}$ of the identified comparator 2* is smaller than the reference potential $V_{ref}^*$ (area Y* shown in FIG. 14) to obtain the input analog potential $A_{in}$ corresponding to the selected comparison operation time (measured value) and calculates the digital conversion value CODE of the obtained input analog potential $A_{in}$ to output.

When the comparison result $Q_A$ of the comparator $2_A$="0" (low level Low), the decoder circuit 7D selects the largest measured value count* among the measured values $count_2$ to $count_3$ of the comparison operation time of the comparators $2_{B0}$ to $2_{B1}$ and identifies the comparator $2_B^*$ with the largest comparison operation time. The decoder circuit 7D uses the correlation characteristics of the identified comparator $2_B^*$ and calculates the digital conversion value CODE of the input analog potential $A_{in}$ based on the comparison result $Q_B^*$ of the identified comparator $2_B^*$ and the selected measured value count*.

When the comparison result $Q_B^*$ of the identified comparator $2_B^*$="1" (high level Hi), the decoder circuit 7D uses the correlation characteristics in the area where the input analog potential $A_{in}$ of the identified comparator $2_B^*$ is greater than the reference potential $V_{ref}^*$ (area $X_B^*$ illustrated in FIG. 14) to obtain the input analog potential $A_{in}$ corresponding to the selected comparison operation time (measured value) and calculates the digital conversion value CODE of the obtained input analog potential $A_{in}$ to output.

When the comparison result $Q_B^*$ of the identified comparator $2_B^*$="0" (low level Low), the decoder circuit 7 uses the correlation characteristics in the area where the input analog potential $A_{in}$ of the identified comparator $2_B^*$ is smaller than the reference potential $V_{ref}^*$ (area $Y_B^*$ shown in FIG. 14) to obtain the input analog potential $A_{in}$ corresponding to the selected comparison operation time (measured value) and calculates the digital conversion value CODE of the obtained input analog potential $A_{in}$ to output.

Any structure may be applied to the comparator $2_A$, but a structure may be preferable to operate at higher speed than the comparators $2_0$ to $2_1$ and the comparators $2_{B0}$ to $2_{B1}$ so that the operation time of the comparator $2_A$ does not become a bottleneck.

The AD converter 1D uses different types (characteristics) of comparators, such as comparators $2_0$ to $2_1$ and the comparators $2_{B0}$ to $2_{B1}$. Thus, when comparators 2 with different types are used, it is necessary to select which type of comparator 2 is used to perform the AD conversion. In this case, as in the AD converter 1B, the selection may be made based on the input analog potential $A_{in}$, or the combination of the comparison result Q and the comparison operation time of each comparator 2.

In the above-described one or more embodiments, one comparator 2* is specified, and the digital conversion value CODE is calculated based on the comparison operation time of the specified comparator 2*. However, it may also be possible to specify comparators 2* and calculate the digital conversion value CODE based on the comparison operation time of the comparators 2*.

As explained above, according to one or more embodiments, the AD converter 1 converts the input analog potential $A_{in}$ into the digital conversion value CODE and comprises the comparator 2 that compares the input analog potential $A_{in}$ with the reference potential $V_{ref}$ and the conversion circuit (TDC circuit 4) that measures the comparison operation time from the start to the end of the comparison operation by the comparator 2 and outputs the digital conversion value CODE according to the measured comparison operation time and the comparison result Q by the comparator 2. With this configuration, the AD conversion may be completed by one comparison operation and arithmetic processing of the result using one comparator 2; therefore, a high-speed and small-sized AD converter 1 may be provided. The AD converter 1 requires only comparator 2 and a reference potential, instead of requiring ($2^n-1$) comparators and ($2^n-1$) reference potentials for n-bit resolution in a flash type AD converter, thereby greatly reducing the circuit area. In addition, the AD converter 1 does not need a large capacitive element for sample and hold or CDAC as in a successive approximation type AD converter, which greatly reduces the circuit area and eliminates the problem of current leakage of a MOS transistor. Furthermore, the AD converter 1 may be provided with a MOS transistor and a diode element as the main components and may benefit from process miniaturization.

According to one or more embodiments, the conversion circuit calculates the digital conversion value CODE from the comparison operation time based on the correlation characteristics of the potential difference between the input analog potential $A_{in}$ and the reference potential $V_{ref}$ and the comparison operation time of the comparator 2. With this configuration, the AD conversion may be executed with high accuracy by using the comparator 2 of the type whose comparison operation time is correlated with the potential difference between the input analog potential $A_{in}$ and the reference potential $V_{ref}$.

According to one or more embodiments, the AD converter 1A converts the input analog potential $A_{in}$ into the digital conversion value CODE, comprising the comparators $2_0$ to $2_3$ that compare the input analog potential $A_{in}$ with each of the different reference potentials $V_{ref0}$ to $V_{ref3}$, and the conversion circuit (decoder circuit 7A) that outputs the digital conversion value CODE according to the comparison operation time from the start to the end of the comparison operation by the specified comparator 2* among the comparators $2_0$ to $2_3$. With this configuration, since the AD conversion may be completed with one comparison operation and arithmetic processing of the result using a small number of comparators 2*, a high-speed and small-sized AD converter 1 may be provided.

According to one or more embodiments, the conversion circuit stores the respective correlation characteristics of the potential differences between the input analog potential $A_{in}$ and each of the reference potentials $V_{ref0}$ to $V_{ref3}$ and the comparison operation time of the comparators $2_0$ to $2_3$, and calculates the digital conversion value CODE from the comparison operation time based on the correlation characteristics of the identified comparators 2*. This configuration allows the use of the correlation characteristics in the area where the comparison operation time varies greatly with respect to the input analog potential $A_{in}$, and the AD conversion may be performed with high accuracy.

According to one or more embodiments, the conversion circuit identifies the comparator 2* based on the comparison operation time. With this configuration, by identifying the comparator 2* with the largest measured value count*, the correlation characteristics of the area where the change in comparison operation time is large in relation to the input analog potential $A_{in}$ may be used, and the AD conversion may be performed with high accuracy.

According to one or more embodiments, the conversion circuit (decoder circuit 7C) identifies the comparator 2* based on the comparison results of the comparators $2_0$ to $2_7$. This configuration allows the comparator 2* to be quickly identified with a simple configuration.

According to one or more embodiments, the comparators $2_{A0}$ to $2_{A2}$, which function as intermediate potential comparators to compare the input analog potential $A_{in}$ with intermediate potentials $V_{ref(0-1)}$, $V_{ref(1-2)}$, $V_{ref(2-3)}$ of the reference potentials $V_{ref0}$ to $V_{ref3}$, are provided, and the conversion circuit (decoder circuit 7B) identifies the comparator based on the comparison results of the comparators $2_{A0}$ to $2_{A2}$. This configuration allows the comparator 2* to be quickly identified with a simple configuration.

According to one or more embodiments, the comparators $2_0$ to $2_1$ and the comparators $2_{B0}$ to $2_{B1}$ consist of a combination of different types. The conversion circuit (decoder circuit 7D) identifies the comparator 2* or $2_B$* of the selected type (comparators $2_0$ to $2_1$ or comparators $2_{B0}$ to $2_{B1}$) based on the comparison result of the comparator $2_A$ that functions as an intermediate potential comparator. With this configuration, since different types of comparators 2 may be used, use of the comparator 2 in an unstable area (potential) may be prevented, and the AD conversion may be executed with high accuracy.

As described above, an AD converter according to one or more embodiments may be possible to complete AD conversion with a single comparison operation and arithmetic processing of the result using a small number of comparators 2. As a result, it may be possible to provide an AD converter 1 that is fast and small in size.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above-described embodiments. Rather, the scope of the invention should be defined in accordance with the following claims and their equivalents.

EXPLANATION OF THE SIGN 1, 1A, 1B, 1C, 1D: Analog-to-digital converter (AD converter)
2, $2_0$ to $2_7$, $2_A$, $2_{A0}$ to $2_{A2}$, $2_{B0}$ to $2_{B1}$: Comparator
3, $3_0$ to $3_7$: End detection circuit
4: Time measurement circuit (TDC circuit)
5A, 5B, 5C, 5D: Voltage divider
6, $6_0$ to $6_3$: Timer
7A, 7B, 7C, 7D: Decoder circuit
8B, 8C: Selection circuit
21, 23: Memory cell
22, 24: Power switch
N1 to N4, NT0 to NT2: N-channel MOS transistor
P1 to P4, PT1 to PT4: P-channel MOS transistor

The invention claimed is:

1. An analog-to-digital converter that converts an input analog potential to a digital conversion value comprising:
    comparators that compare the input analog potential with different reference potentials, respectively;
    a conversion circuit that outputs the digital conversion value according to a comparison operation time from a start to an end of a comparison operation by a comparator identified among the comparators; and
    an end detection circuit comprising an exclusive-OR circuit that detects the end time of the operation of the comparator, wherein
    each of the comparators comprises a power switch comprising a P-channel MOS transistor and a memory cell comprising CMOS-type SRAM, and
    the comparison operation time for the comparison operation by the identified comparator and a potential difference between the input analog potential and the respective reference potential for the identified comparator are correlated in the comparator such that the smaller the potential difference, the longer the comparison operation time, and the larger the potential difference, the shorter the comparison operation time.

2. The conversion circuit according to claim 1, wherein
    respective correlation characteristics of the potential difference between the input analog potential and the reference potential and the comparison operation time of the comparators are stored in the respective memory cell, and
    the digital conversion value is calculated from the comparison operation time based on the correlation characteristics of the identified comparator.

3. The analog-to-digital converter according to claim 1, wherein
    the conversion circuit identifies the comparator based on the comparison operation time.

4. The analog-to-digital converter according to claim 1, wherein
    the conversion circuit identifies the comparator based on comparison results of the comparators.

5. The analog-to-digital converter according to claim 1, further comprising:
    an intermediate potential comparator that compares the input analog potential with an intermediate potential of the reference potentials, wherein
    the conversion circuit identifies the comparator based on a comparison result of the intermediate potential comparator.

6. The analog-to-digital converter according to claim 5, wherein
    the comparators comprise a combination of different types of comparators, and
    the conversion circuit identifies the comparator of the identified type based on a comparison result of the intermediate potential comparator.

* * * * *